(12) United States Patent
Wu

(10) Patent No.: US 7,129,801 B2
(45) Date of Patent: Oct. 31, 2006

(54) INTERPOLATIVE VARACTOR VOLTAGE CONTROLLED OSCILLATOR WITH CONSTANT MODULATION SENSITIVITY

(75) Inventor: Yue Wu, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 10/789,532

(22) Filed: Feb. 27, 2004

(65) Prior Publication Data

US 2005/0190003 A1   Sep. 1, 2005

(51) Int. Cl.
*H03B 1/00* (2006.01)
(52) U.S. Cl. .......................... 331/177 V; 331/117 FE; 331/117 R; 331/36 C; 331/167; 331/185
(58) Field of Classification Search ............ 331/177 V, 331/117 FE, 167, 117 R, 36 C, 185
See application file for complete search history.

(56) References Cited

U.S. PATENT DOCUMENTS 6,292,065 B1 *   9/2001   Friedman et al. ....... 331/117 R
6,774,736 B1 *   8/2004   Kwek et al. ............ 331/177 V
6,885,275 B1 *   4/2005   Chang ........................ 336/200
6,906,596 B1 *   6/2005   Kitamura et al. ......... 331/36 C
6,917,248 B1 *   7/2005   Nguyen ................... 331/117 R

* cited by examiner

*Primary Examiner*—Arnold Kinkead
(74) *Attorney, Agent, or Firm*—Philip Wadsworth; Charles D. Brown; Donald C. Kordich

(57) ABSTRACT

A tunable oscillator having a tuning voltage input includes an inductor, and first and second varactor pairs arranged with the inductor to generate a signal having a frequency responsive to a tuning voltage applied to the tuning voltage input, each of the varactor pairs having a bias voltage input that may be controlled independently of the other varactor pair. The first varactor pair may be biased such that its capacitance varies substantially linearly with the tuning voltage over a first portion of the tuning range, and the second varactor pair may be biased such that its capacitance varies substantially linearly with the tuning voltage over a second portion of the tuning range.

14 Claims, 4 Drawing Sheets

INTERPOLATIVE VARACTOR VOLTAGE CONTROLLED OSCILLATOR WITH CONSTANT MODULATION SENSITIVITY

BACKGROUND

1. Field

The present disclosure relates generally to tunable oscillator circuits. More particularly, the disclosure relates to a tunable voltage controlled oscillator (VCO) circuit with a relatively constant modulation sensitivity over a wide tuning range.

2. Background

Oscillators are used as stable frequency sources in diverse electronic applications. By way of example, in communication systems, oscillators are often used to provide a stable frequency reference signal for translating information signals to a desired frequency band. In conventional multi-channel communication systems, circuit arrangements employing multiple oscillators may be used to provide a selectable frequency source. This approach is generally used for high speed switching applications. For less critical applications, a more economical approach entails the use of a tunable oscillator circuit comprising a voltage controlled oscillator which can be phased locked to a frequency reference signal.

In conventional VCO designs, varactors (variable capacitors) may be used for frequency tunability. In typical VCO designs, a controlled voltage determines the varactor capacitance which in turn determines the VCO output frequency. The varactors are typically biased around the center of the VCO's frequency tuning range. The frequency tuning characteristics of a typical varactor has two regions: a) a steep capacitance versus voltage slope for certain voltages and b) a saturated capacitance for other voltages. The steep capacitance versus voltage region of the curve may yield increased output phase noise. For example, a small noise voltage at the controlled voltage input causes a relatively large capacitance variation and therefore a noticeable undesired VCO phase noise due to the high sensitivity of the steep curve region. The saturation region of the capacitance versus voltage curve may yield a limited frequency tuning range such that voltages beyond a particular voltage threshold will have very little effect in changing the total capacitance and therefore the VCO output frequency. For example, in one typical design, the frequency tuning range of the VCO is approximately 2 volts (0.4 volts to 2.3 volts), but any voltage higher than 1.6 volts will only minimally change the capacitance and therefore the VCO output frequency.

Accordingly, it would be desirable to have VCO designs which have a wide frequency tuning range but with reduced output phase noise.

SUMMARY

In one aspect of the present invention, a tunable oscillator has a tuning voltage input. The tunable oscillator includes an inductor, and first and second varactor pairs arranged with the inductor to generate a signal having a frequency responsive to a tuning voltage applied to the tuning voltage input, each of the varactor pairs having a bias voltage input that may be controlled independently of the other varactor pair.

In another aspect of the present invention, a tunable oscillator has a tuning range. The tunable oscillator includes an inductor, and first and second varactor pairs arranged with the inductor to generate a signal having a frequency responsive to a tuning voltage, wherein the first varactor pair is biased such that its capacitance varies substantially linearly with the tuning voltage over a first portion of the tuning range, and the second varactor pair is biased such that its capacitance varies substantially linearly with the tuning voltage over a second portion of the tuning range.

In yet another aspect of the present invention, a phase locked loop includes a tunable oscillator having an inductor, and first and second varactor pairs arranged with the inductor to generate a signal having a frequency responsive to a tuning voltage, each of the varactor pairs having a bias voltage input that may be controlled independently of the other varactor pair, a divider configured to scale the signal frequency from the tunable oscillator, a phase detector configured to generate an error signal representative of a phase difference between the scaled signal frequency and a reference frequency, and a loop filter configured to filter the error signal, the filtered error signal comprising the tuning voltage.

It is understood that other embodiments of the present invention will become readily apparent to those skilled in the art from the following detailed description, wherein it is shown and described various embodiments of the invention by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Aspects of the present invention are illustrated by way of example, and not by way of limitation, in the accompanying drawings, wherein.

DETAILED DESCRIPTION

The detailed description set forth below in connection with the appended drawings is intended as a description of various embodiments of the present invention and is not intended to represent the only embodiments in which the present invention may be practiced. Each embodiment described in this disclosure is provided merely as an example or illustration of the present invention, and should not necessarily be construed as preferred or advantageous over other embodiments. The detailed description includes specific details for the purpose of providing a thorough understanding of the present invention. However, it will be apparent to those skilled in the art that the present invention may be practiced without these specific details. In some instances, well-known structures and devices are shown in block diagram form in order to avoid obscuring the concepts of the present invention. Acronyms and other descriptive terminology may be used merely for convenience and clarity and are not intended to limit the scope of the invention. In addition, for the purposes of this disclosure, the term "coupled" means "connected to" and such connection can either be direct or, where appropriate in the context, can be indirect, e.g., through intervening or intermediary devices or other means.

Figure 1:
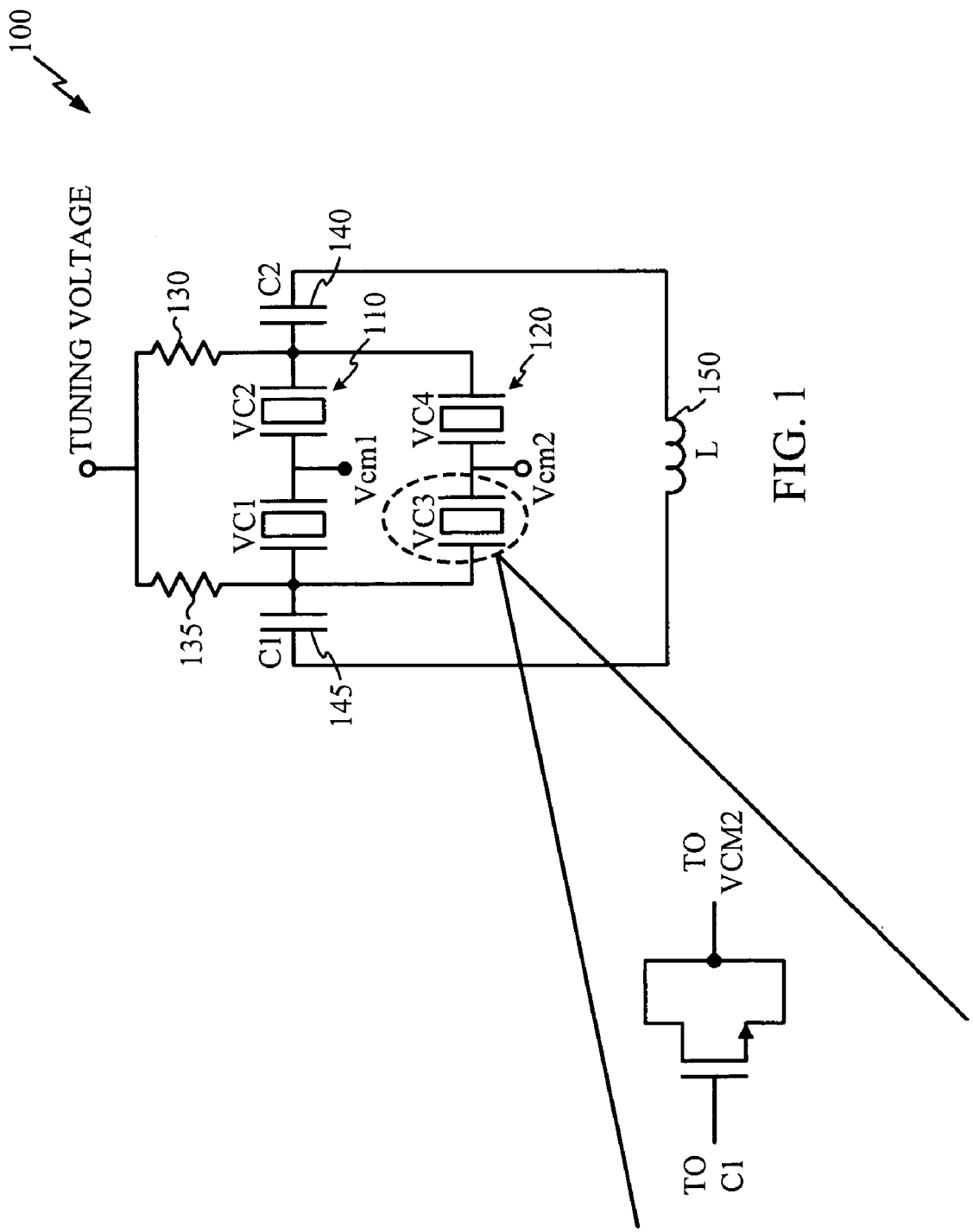
FIG. 1 is a schematic diagram of the tuning circuit of a VCO.

FIG. 1 is a schematic diagram of the VCO tuning circuit 100 of VCO 10. The VCO tuning circuit 100 allows the VCO 10 to have a wide frequency tuning range without significantly increasing output phase noise. In one embodiment, the VCO tuning circuit 100 includes two varactor pairs 110, 120, two resistors 130, 135, two capacitors 140, 145 and an inductor 150. A tuning voltage may be applied to the two varactor pairs 110 (VC1, VC2) and 120 (VC3, VC4) through the two resistors 130, 135. The resistors 130, 135 may be used to create a high impedance input so that the tuning voltage is not loaded down by the VCO 10. One skilled in the art would understand that any high impedance path may be used in place of resistors 130, 135. The two capacitors 140, 145 (which are DC blocking capacitors) may be used to prevent current from being injected into the VCO 10 from the tuning voltage source. One skilled in the art would understand that any DC blocking path may be used in place of capacitors 140, 145. Additionally, in one embodiment, each of the varactor pairs 110, 120 may include a bias voltage ($V_{cm1}$, $V_{cm2}$). The bias voltage can be chosen to adjust capacitance over voltage characteristic of the varactor pairs 110, 120.

In one embodiment, each of the varactors (VC1, VC2, VC3, VC4) may be implemented with a metal oxide semiconductor field effect transistor (MOSFET) having its drain tied its source. Each of the varactor pairs 110, 120, may comprise two MOSFETs connected in series at the drain-source connection. Each of the varactors pairs 110, 120 may be biased by applying a voltage to the common drain-source connection. The tuning voltage may be applied to the gate of each MOSFET through respective input resistors 130, 135. Since the VCO frequency depends inversely on the square root of the product of inductance and varactor capacitance, and since the inductance of inductor 150 is fixed, then as the capacitance of the varactors (VC1, VC2, VC3, VC4) is varied by the applied tuning voltage, the VCO frequency will vary accordingly.

Figure 2:
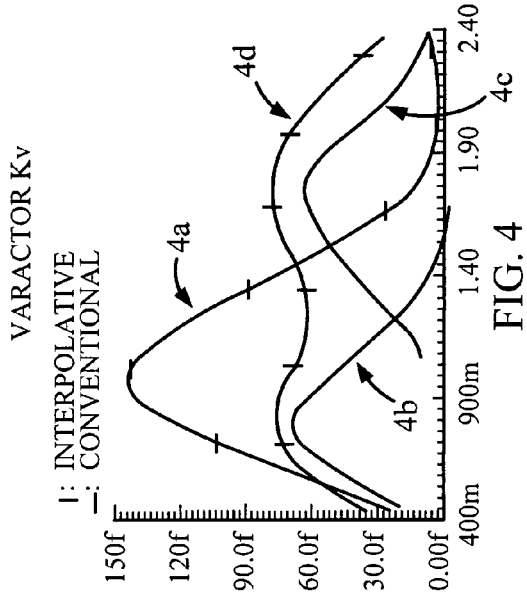
FIG. 2 illustrates two graphs: first, a graph of a conventional VCO varactor capacitance versus tuning voltage curve; and second, a graph of a VCO varactor capacitance versus tuning voltage curve in accordance with the tuning circuit of FIG. 1.

FIG. 2 illustrates two graphs: graph 2a is a graph of a conventional VCO varactor capacitance versus tuning voltage curve, and graph 2b is a graph of the VCO varactor capacitance versus tuning voltage curve in accordance with the embodiment shown in FIG. 1. In graph 2a of FIG. 2, at the lower tuning voltages, the capacitance is approximately linearly proportional to the tuning voltage. However, at tuning voltages greater than approximately 1.6 volts, the capacitance saturates as voltage increases, decreasing the tunability of the VCO 10. In contrast, implementing the two varactor pairs 110, 120 into the VCO tuning circuit 100 yields a VCO varactor capacitance versus tuning voltage curve that remains approximately linear for a wider tuning voltage range, as shown in graph 2b of FIG. 2. Thus, as shown by the characteristic of graph 2b of FIG. 2, the varactor capacitance will change proportionally to the changing VCO tuning voltage for a wider tuning voltage range.

Figure 3:
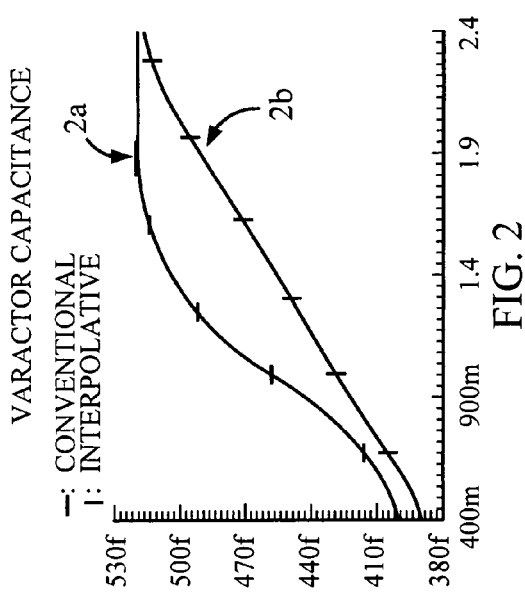
FIG. 3 illustrates two graphs, each graph representing the individual capacitance versus tuning voltage curves of the two constituent VCO varactor pairs in accordance with the tuning circuit of FIG. 1.

FIG. 3 illustrates two graphs, each graph representing the individual capacitance versus tuning voltage curves of the two constituent VCO varactor pairs 110, 120. Graph 3a of FIG. 3 corresponds to the VCO varactor pair 110 while graph 3b of FIG. 3 corresponds to the VCO varactor pair 120. In graph 3a of FIG. 3, the varactor capacitance of varactor pair 110 is linearly proportional to the lower tuning voltage range of approximately 0.4 to 1.4 volts. Complimenting the linear characteristic shown in graph 3a, graph 3b of FIG. 3 shows that the varactor capacitance is linearly proportional to the higher tuning voltage range of approximately 1.1 to 2.4 volts. By implementing the two varactor pairs 110, 120 in the VCO tuning circuit 100 (shown in FIG. 1), their constituent linear characteristics at the lower tuning voltages and at the higher tuning voltages are combined, resulting in a capacitance characteristic that is linearly proportional to a wider tuning voltage range of 0.4 to 2.4 volts as illustrated in graph 2b of FIG. 2. One skilled in the art would understand that the stated tuning voltage values are presented for illustration only, and that other tuning voltage values may be used without departing from the spirit of the invention.

Figure 4:
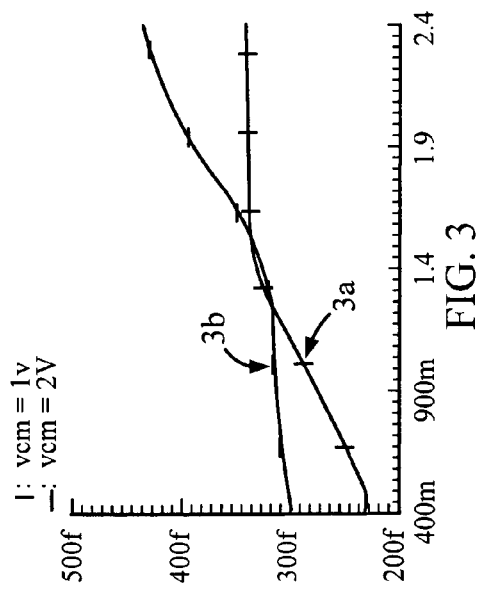
FIG. 4 illustrates four graphs: first, a graph of the modulation sensitivity $K_v$ of a conventional VCO; second, two similar graphs of the modulation sensitivity $K_v$ of the two constituent VCO varactor pairs in accordance with the tuning circuit of FIG. 1; and third, a graph of the modulation sensitivity $K_v$ of the superposition of the two constituent VCO varactor pairs in accordance with the tuning circuit of FIG. 1.

FIG. 4 illustrates four graphs: graph 4a is a graph of the modulation sensitivity $K_v$ of the conventional VCO; graph 4b and 4c are two similar graphs of the modulation sensitivity $K_v$ of the two constituent VCO varactor pairs in accordance with the embodiment of FIG. 1; graph 4d is a graph of the modulation sensitivity $K_v$ of the superposition of the two constituent VCO varactor pairs in accordance with the embodiment of FIG. 1. Modulation sensitivity $K_v$ is defined as the incremental change of the varactor capacitance per incremental change of tuning voltage (i.e., the instantaneous slope of the curves presented in graphs 2a and 2b of FIG. 2).

In graph 4a of FIG. 4, the peak value of the modulation sensitivity $K_v$ for a conventional VCO tuning circuit is relatively high which results in increased susceptibility to undesired input noise, causing increased output phase noise. Additionally, its usable tuning range is limited to a portion of the desired tuning voltage range as shown by its rapid drop-off at approximately 1.6 volts. In contrast, graph 4d of FIG. 4 illustrates a near constant modulation sensitivity $K_v$ of the two varactor pairs 110, 120 over the entire tuning voltage range (0.4 to 2.4 volts). The near constant modulation sensitivity $K_v$ characteristic yields a wider tuning voltage range. In addition, since the constant modulation sensitivity $K_v$ value is relatively smaller than in graph 4a, the susceptibility to input noise is reduced, causing a reduction in output phase noise. One skilled in the art would understand that the particular characteristics (such as, but not limited, to the drop-off value and tuning voltage range) of the modulation sensitivity $K_v$ is given as an example for illustrative purposes only.

Although FIG. 1 shows only two varactor pairs, multiple cascading varactor pairs, each pair with different and complimenting bias values, may be implemented into the VCO tuning circuit 100 without violating the spirit of the present invention. Multiple cascading varactor pairs may be used to increase the tuning voltage range beyond that of the tuning voltage range of using only two varactor pairs. By implementing the multiple cascading varactor pairs in the VCO tuning circuit 100, the constituent linear characteristics of each varactor pair at the different tuning voltage ranges may result in a capacitance characteristic that is linearly proportional to an even wider tuning voltage range than that of implementing two varactor pairs. Additionally, multiple cascading varactor pairs may be implemented to keep the VCO susceptibility to input noise at a minimum and thus minimizing the output phase noise.

Figure 5:
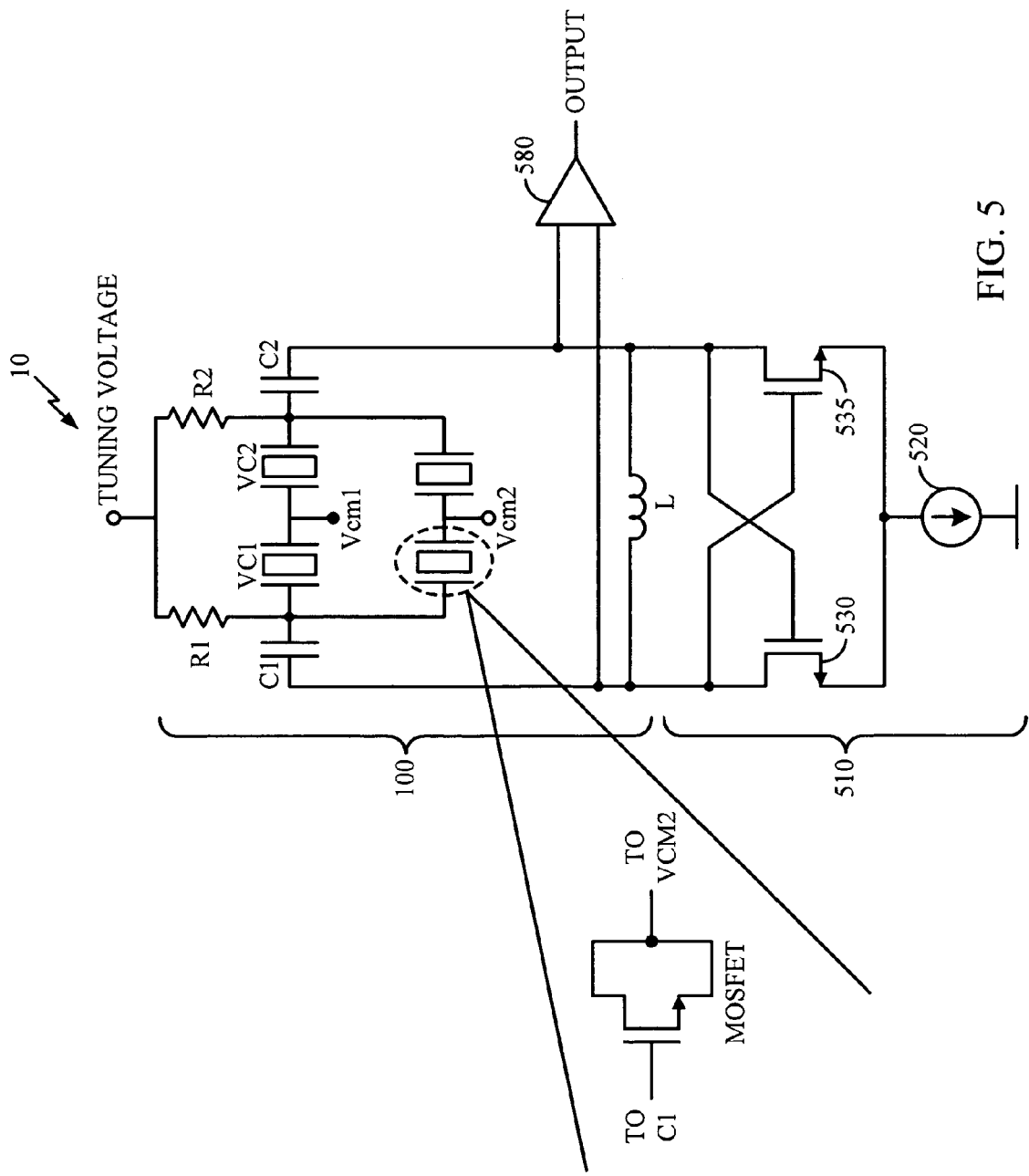
FIG. 5 is a schematic diagram of the VCO of the present invention showing the VCO tuning circuit and other circuits associated with the input current circuit and output amplifier of the VCO.

FIG. 5 is a schematic diagram of the VCO 10 showing the VCO tuning circuit 100 and other circuits associated with the input current circuit 510 and output amplifying circuit 580 of the VCO 10. The input current circuit 510 supplies current to the VCO tuning circuit 100 of the VCO 10. In one embodiment, the input current circuit 510 includes a constant current source 520 and a pair of cross-coupled transistors 530, 535 to inject current into the VCO tuning circuit 100. One skilled in the art would understand that alternatives to the input current circuit, such as, but not limited to, a voltage source could be used without violating the spirit of the present invention.

The output amplifying circuit 580 shown in FIG. 5 amplifies a low-level VCO waveform to generate a VCO output waveform to be outputted by the VCO. In one embodiment, the output amplifying circuit 580 includes a differential-to-single ended amplifier. One skilled in the art would understand that other types of amplifiers could be used within the spirit of the present invention.

Figure 6:
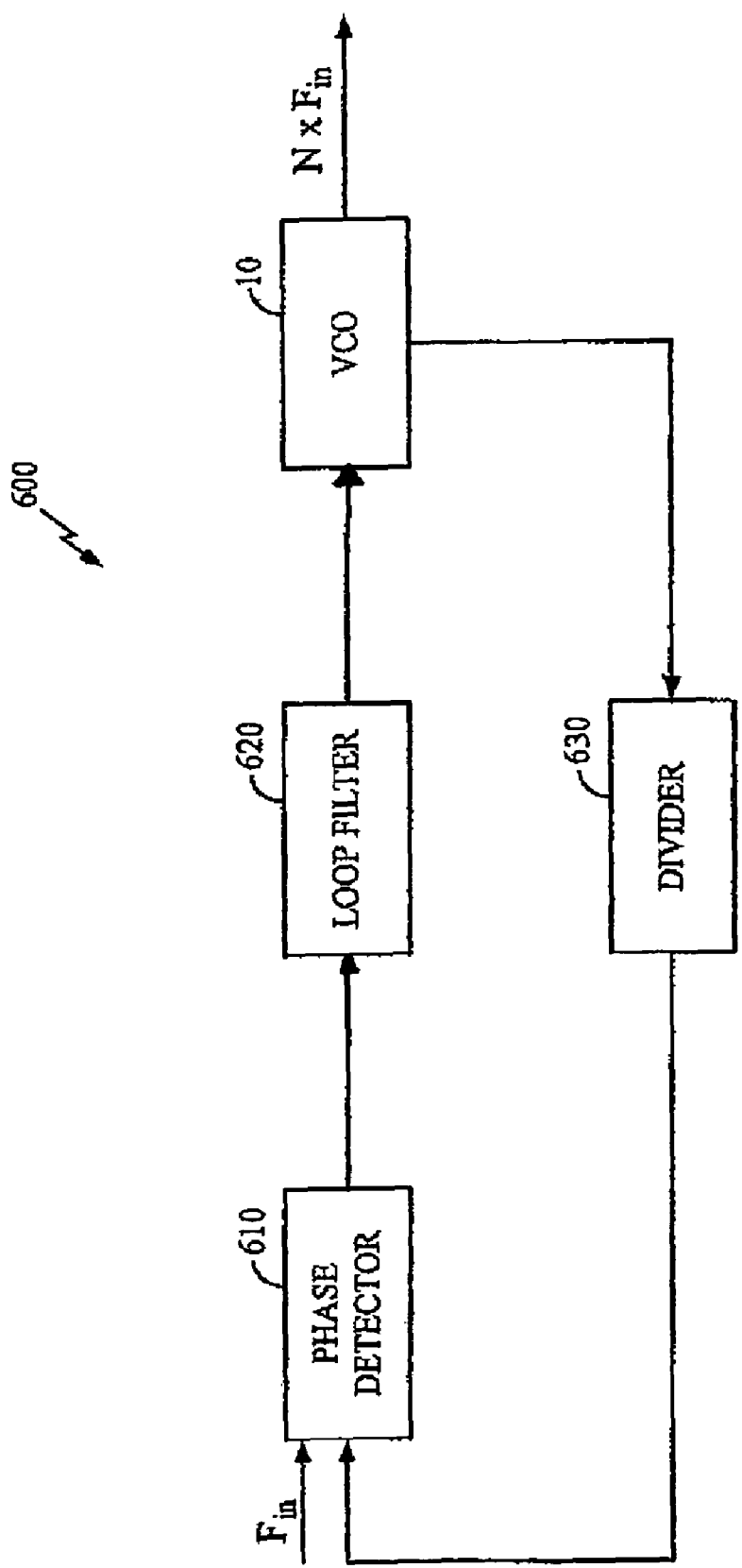
FIG. 6 is a block diagram of a VCO operating in a phase locked loop.

The VCO 10 described thus far may be used in any application that requires a tunable oscillator. For the puroses of clarity and completeness, one such application will be discussed below in connection with a phase lock loop. FIG. 6 is a block diagram of a phase locked loop circuit 600 using the VCO 10. In one embodiment, the phase locked loop circuit 600 includes the VCO 10, a phase detector 610, a loop filter 620 and a divider 630. The phase locked loop circuit 600 uses feedback to lock the VCO 10 to a reference frequency $F_{in}$ (usually generated by a highly stable crystal oscillator). The output of the VCO 10 is typically connected to a coupler that directs a portion of the VCO output waveform to the feedback loop that connects to an input of the phase detector 610. The remainder of the VCO output waveform is applied to and consumed by an external load.

The frequency of the VCO output waveform is usually an integer multiple of the reference frequency $F_{in}$. The portion of the output waveform from the VCO 10, which is directed to the feedback loop, may be provided to the divider 630 before being applied to the phase detector 610. The divider 630 scales the frequency of the VCO output waveform to generate a frequency-scaled VCO output waveform in accordance with the reference frequency and the desired operating frequency of the VCO 10. In one embodiment, the divider 630 may be implemented with a programmable frequency scale factor N which is the ratio of the desired VCO output frequency to the reference frequency $F_{in}$. For example, if the reference frequency $F_{in}$ is 100 MHz and the VCO 10 operates at 200 MHz, a divide-by-two divider 630 would be used. The phase detector 610 compares the reference waveform with reference frequency $F_{in}$ to the frequency-scaled VCO output waveform to record their phase difference. The phase detector 610 generates a phase detector output signal with a DC component which is proportional to the phase difference between the reference waveform and the frequency-scaled VCO output waveform. In one embodiment, the loop filter 620 filters out the other undesired noise components of the phase detector output signal. The DC component, which may be referred to as an "error signal," may then be applied to the tuning input of the VCO 10 to adjust the frequency of the VCO output waveform to the desired integer multiple of the reference frequency $F_{in}$.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A tunable oscillator having a tuning voltage input, comprising:
   an inductor;
   first and second varactor pairs arranged with the inductor to generate a signal having a frequency responsive to a tuning voltage applied to the tuning voltage input, each of the varactor pairs having a bias voltage input that may be controlled independently of the other varactor pair; and
   wherein each of the varactor pairs comprises two serially coupled varactors each having a first node coupled to the tuning voltage input and a second node coupled to its respective bias voltage input.

2. The tunable oscillator of claim 1 wherein each of the varactors comprises a MOSFET having a gate, a drain, and a source connected to the drain, and wherein the first node of the varactor comprises the gate and the second node of the varactor comprises the drain and source connection.

3. The tunable oscillator of claim 1 further comprising a first resistor coupled between the tuning voltage input and the first node of a first one of the varactors in each of the varactor pairs, and a second resistor coupled between the tuning voltage input and the first node of a second one of the varactors in each of the varactor pairs.

4. The tunable oscillator of claim 1 further comprising a first capacitor coupled between a first node of the inductor and the first node of a first one of the varactors in each of the varacror pairs, and a second capacitor coupled between a second node of the inductor and the first node of a second one of the varactors in each of the varactor pairs.

5. The tunable oscillator of claim 1 further comprising an input current source to the inductor and the first and second varactor pairs.

6. The tunable oscillator of claim 5 wherein the input current source comprises a constant current source coupled to a pair of cross-coupled transistors.

7. The tunable oscillator of claim 1 further comprising a differential-to-single ended amplifier having a differential input coupled across the inductor.

8. A tunable oscillator having a tuning range, comprising:
   an inductor; and
   first and second varactor pairs arranged with the inductor to generate a signal having a frequency responsive to a tuning voltage, wherein the first varactor pair is biased such that its capacitance varies substantially linearly with the tuning voltage over a first portion of the tuning range, and the second varactor pair is biased such that its capacitance varies substantially linearly with the tuning voltage over a second portion of the tuning range, wherein the each of the varactor pairs comprises two serially coupled varactors each having a first node configured to receive the tuning voltage and a second node, each of the varactor pairs being biased at the second node of its respective varactors, wherein the biasing at the second node of each varactor pair is controlled independently of the other varactor pair.

9. The tunable oscillator of claim 8 wherein each of the varactors comprises a MOSFET having a gate, a drain, and a source connected to the drain, and wherein the first node of the varactor comprises the gate and the second node of the varactor comprises the drain and source connection.

10. The tunable oscillator of claim 8 further comprising first and second resistors, the first node of a first one of the varactors in each of the varactor pairs being configured to receive the tuning voltage through the first resistor, and the first node of a second one of the varactors in each of the varactor pairs being configured to receive the tuning voltage through the second resistor.

11. The tunable oscillator of claim 8 further comprising a first capacitor coupled between a first node of the inductor and the first node of a first one of the varactors in each of the varactor pairs, and a second capacitor coupled between a second node of the inductor and the first node of a second one of the varactors in each of the varactor pairs.

12. The tunable oscillator of claim 8 wherein the first varactor pair is biased at approximately 1 volt when power is applied, and the second varactor pair is biased at approximately 2 volts when power is applied.

13. The tunable oscillator of claim 8 wherein the first portion of the tuning range is about 0.4 volts to about 1.4 volts when power is applied, and the second portion of the tuning range is about 1.1 volts to about 2.4 volts when power is applied.

14. A phase locked loop, comprising:
 a tunable oscillator having an inductor, and first and second varactor pairs arranged with the inductor to generate a signal having a frequency responsive to a tuning voltage, each of the varactor pairs having a bias voltage input that may be controlled independently of the other varactor pair, wherein each of the varactor pairs comprises two serially coupled varactors each having a first node coupled to the tuning voltage input and a second node coupled to its respective bias voltage input;
 a divider configured to scale the signal frequency from the tunable oscillator;
 a phase detector configured to generate an error signal representative of a phase difference between the sealed signal frequency and a reference frequency; and
 a loop filter configured to filter the error signal, the filtered error signal comprising the tuning voltage.

* * * * *